(12) United States Patent
Hause et al.

(10) Patent No.: US 6,337,217 B1
(45) Date of Patent: Jan. 8, 2002

(54) METHOD AND APPARATUS FOR IMPROVED FOCUS IN OPTICAL PROCESSING

(75) Inventors: Frederick N. Hause, Austin; Karen L. E. Turnquest, Pflugerville, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/503,406

(22) Filed: Feb. 14, 2000

(51) Int. Cl.[7] .......................... H01L 21/00; G21K 5/10; G03F 9/00
(52) U.S. Cl. .................. 438/7; 430/30; 430/22; 250/252.1; 250/492.22
(58) Field of Search .................. 438/5, 7, 14, 16; 250/252.1, 201.1, 201.2, 204, 205, 492.2, 492.22; 430/22, 30

(56) References Cited

U.S. PATENT DOCUMENTS 5,989,764 A * 11/1999 Adams
6,027,842 A * 2/2000 Ausschnitt et al.
6,130,750 A * 10/2000 Ausschnitt et al.

* cited by examiner

Primary Examiner—Charles Bowers
Assistant Examiner—Evan Pert
(74) Attorney, Agent, or Firm—Williams, Morgan & Amerson, P.C.

(57) ABSTRACT

The present invention provides for a method and an apparatus for performing automatic control adjustments during photolithography processes. A plurality of semiconductor devices are processed. Optical data analysis is performed upon at least one of the processed semiconductor device. Control adjustments to the processing is performed in response to the optical data analysis.

30 Claims, 6 Drawing Sheets

METHOD AND APPARATUS FOR IMPROVED FOCUS IN OPTICAL PROCESSING

BACKGROUND OF THE INVENTION

1. Field of the Invention

This invention relates generally to semiconductor products manufacturing, and, more particularly, to a method and apparatus for monitoring and performing improved focus methods for photolithography processing of semiconductor devices.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical (CMT) control, etching, and overlay control. Overlay is one of several important steps in the photolithography area of semiconductor manufacturing. The overlay process involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduction of misalignment errors increases dramatically. Errors in photolithography processes are also caused by inadequate focusing during exposure steps.

Generally, photolithography engineers currently analyze the overlay and misalignment errors a few times a month. The results from the analysis of the overlay and misalignment errors are used to make updates to exposure tool settings manually. Generally, a manufacturing model is employed to control the manufacturing processes. Some of the problems associated with the current methods include the fact that the exposure tool settings are only updated a few times a month. Furthermore, currently the exposure tool updates are performed manually. Many times, errors in semiconductor manufacturing are not organized and reported to quality control personnel. Often, the manufacturing models themselves incur bias errors that could compromise manufacturing quality.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. These errors can cause appreciable inconsistencies in the critical dimensions of multiple parameters in the processed semiconductor devices. Many times photolithography processes are performed outside an acceptable focus window, causing degradation in the quality of manufactured semiconductor devices. Manual monitoring of manufacturing parameters during photolithography processes can improve focus during exposure process but can result in some focus errors.

The present invention is directed to overcoming, or at least reducing the effects of, one or more of the problems set forth above.

SUMMARY OF THE INVENTION

In one aspect of the present invention, a method is provided for performing automatic control adjustments during photolithography processes. A plurality of semiconductor devices are processed. Optical data analysis is performed upon at least one of the processed semiconductor devices. Control adjustments to the processing are performed in response to the optical data analysis.

In another aspect of the present invention, an apparatus is provided for performing automatic control adjustments. The apparatus of the present invention comprises: a processing tool capable of processing semiconductor devices; an optical sensor coupled with said processing tool, said optical sensor being capable of acquiring optical manufacturing data during the operation of said processing tool; a machine interface electronically coupled with said processing tool and said optical sensor such that said machine interface is capable of delivering a control signal to said processing tool and receiving the optical manufacturing data from said optical sensor; a metrology tool coupled with said processing tool, said metrology tool being capable of receiving a processed semiconductor wafer from said processing tool and performing metrology data acquisition upon said processed semiconductor wafer; and a system electronically interfaced with said machine interface and said metrology tool, said system being capable of receiving data from said machine interface and sending a control signal to said machine interface.

BRIEF DESCRIPTION OF THE DRAWINGS

The invention may be understood by reference to the following description taken in conjunction with the accompanying drawings, in which like reference numerals identify like elements, and in which.

Figure 1:
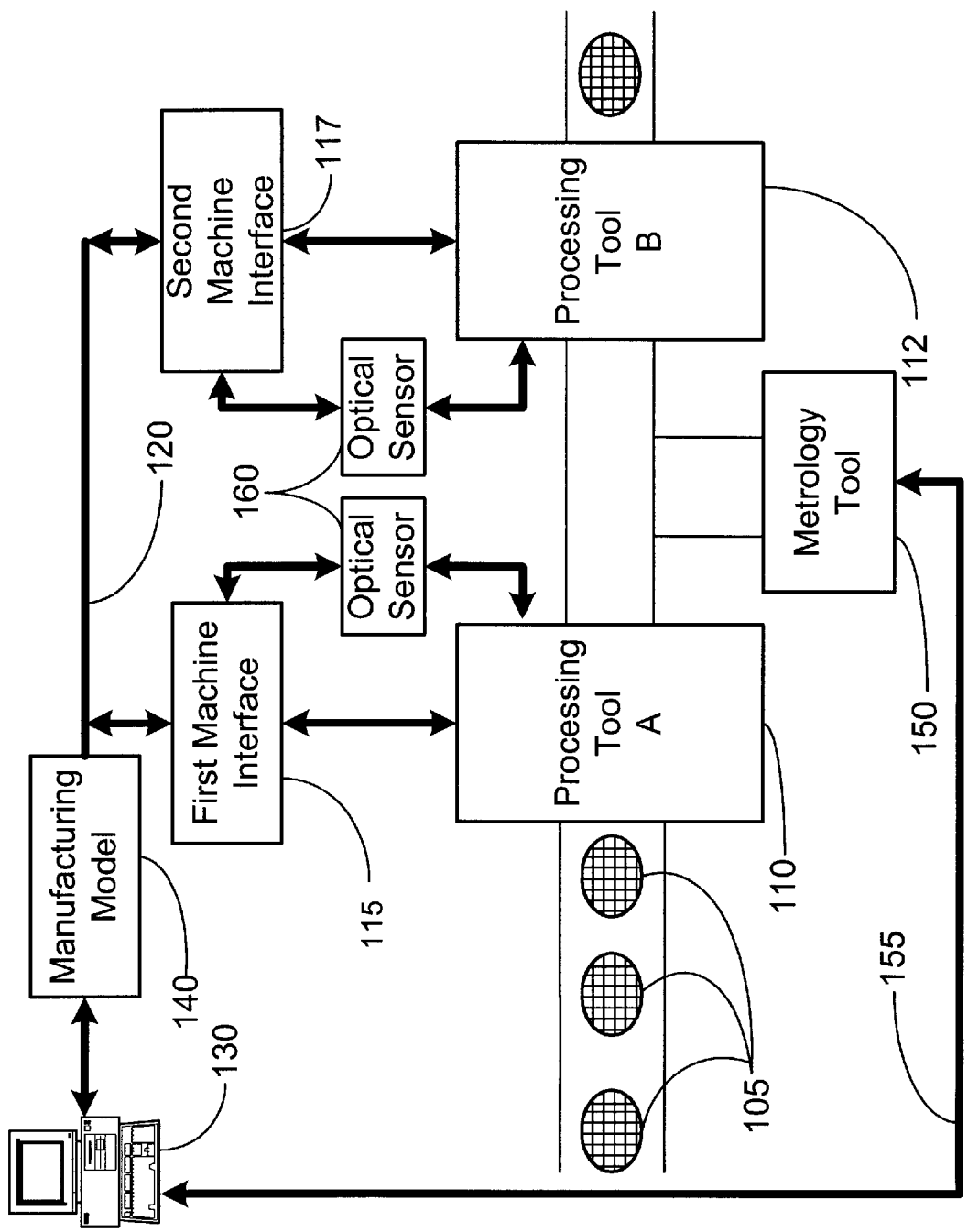
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. One process in semiconductor manufacturing is the overlay process. In particular, the overlay process involves measuring misalignment errors between semiconductor layers during manufacturing processes. Improvements in semiconductor manufacturing processes, such as the overlay process, could result in substantial enhancements, in terms of quality and efficiency, in manufacturing of semiconductor devices. As semiconductor devices are processed through manufacturing tools, production data, or manufacturing data, is generated. The production data that is acquired can be used to automatically perform correction from one manufacturing run of semiconductor devices to another (run-to-run basis). The present invention provides a method of implementing automated error correction for control of semiconductor processes, such as the overlay process. Furthermore, the present invention provides a method of performing run-to-run control of semiconductor manufacturing processes.

In photolithography processes, operating within an acceptable focus window is important in reducing manufacturing defects in semiconductor devices. The ability to make wafer by wafer focus assessments and feeding that information to subsequent process steps to make focus corrections can improve the quality of processed semiconductor devices. The present invention teaches a method and an apparatus for automatically acquiring and analyzing focus data and making corrections for subsequent manufacturing processes.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers, scanners, and step-and-scan tools.

For processing tools such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

A metrology tool 150, such as a measurement tool for measuring misalignment and misregistration errors, is employed in the semiconductor device manufacturing system illustrated in FIG. 1. In one embodiment, the metrology tool 150 is capable of performing photolithography registration measurements on semiconductor products 105 that are processed by the processing tools 110, 112. In one embodiment, data from the metrology tool 150 is sent, on a line 155, to the computer system 130, which in one embodiment is part of a process control system (not shown), such as an APC system.

When the processing tools 110, 112 perform photolithography processing on the semiconductor products 105, an optical sensor 160 monitors the process and acquires optical manufacturing data. In one embodiment, the optical manufacturing data acquired by the optical sensor 160 is sent to the machine interfaces 115, which sends the optical manufacturing data to the computer system 130 via the line 120. In one embodiment, the computer system 130, which in one embodiment is part of a process control system, correlates and compares the optical manufacturing data with the corresponding manufacturing data from the metrology tool 150. The present invention teaches a method of utilizing the optical manufacturing data and manufacturing data from the metrology tool 150 to perform corrections for photolithography processes on a run-to-run basis as well as on a wafer-to-wafer basis.

Figure 2:
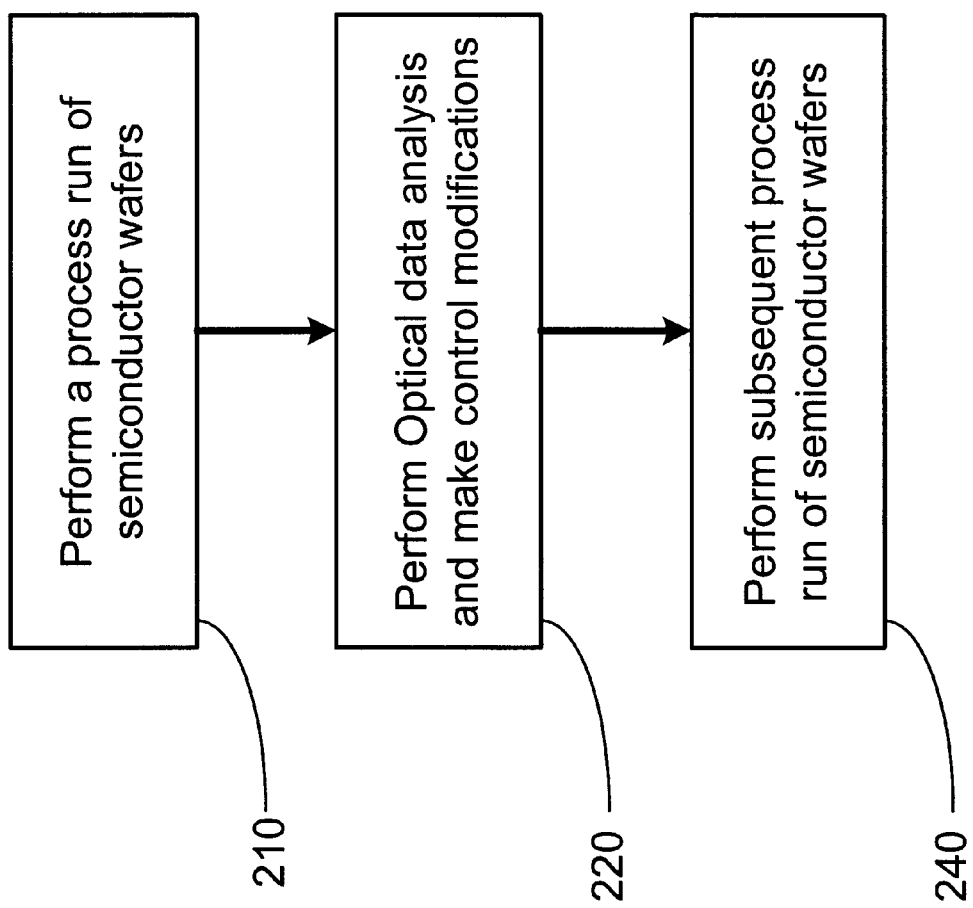
FIG. 2 illustrates a flowchart representation of one method of performing automated focus adjustment in a processing tool, as taught by the present invention.

Turning now to FIG. 2, a flowchart representation of one method of performing automated optical feedback control correction, as taught by the present invention, is illustrated. A manufacturing process run of semiconductor devices, such as semiconductor wafers, is performed, as described in block 210 of FIG. 2. Optical data analysis is performed with the optical manufacturing data that is acquired during the processing run of semiconductor wafers, as described in block 220 of FIG. 2. Furthermore, control modifications are performed on the control signals on the line 120 in response to the optical manufacturing data analysis described in block 220 of FIG. 2. A flowchart representation of a more detailed depiction of the method of performing the optical data analysis and the control modifications steps described in FIG. 2, is illustrated in FIG. 3.

Figure 3:
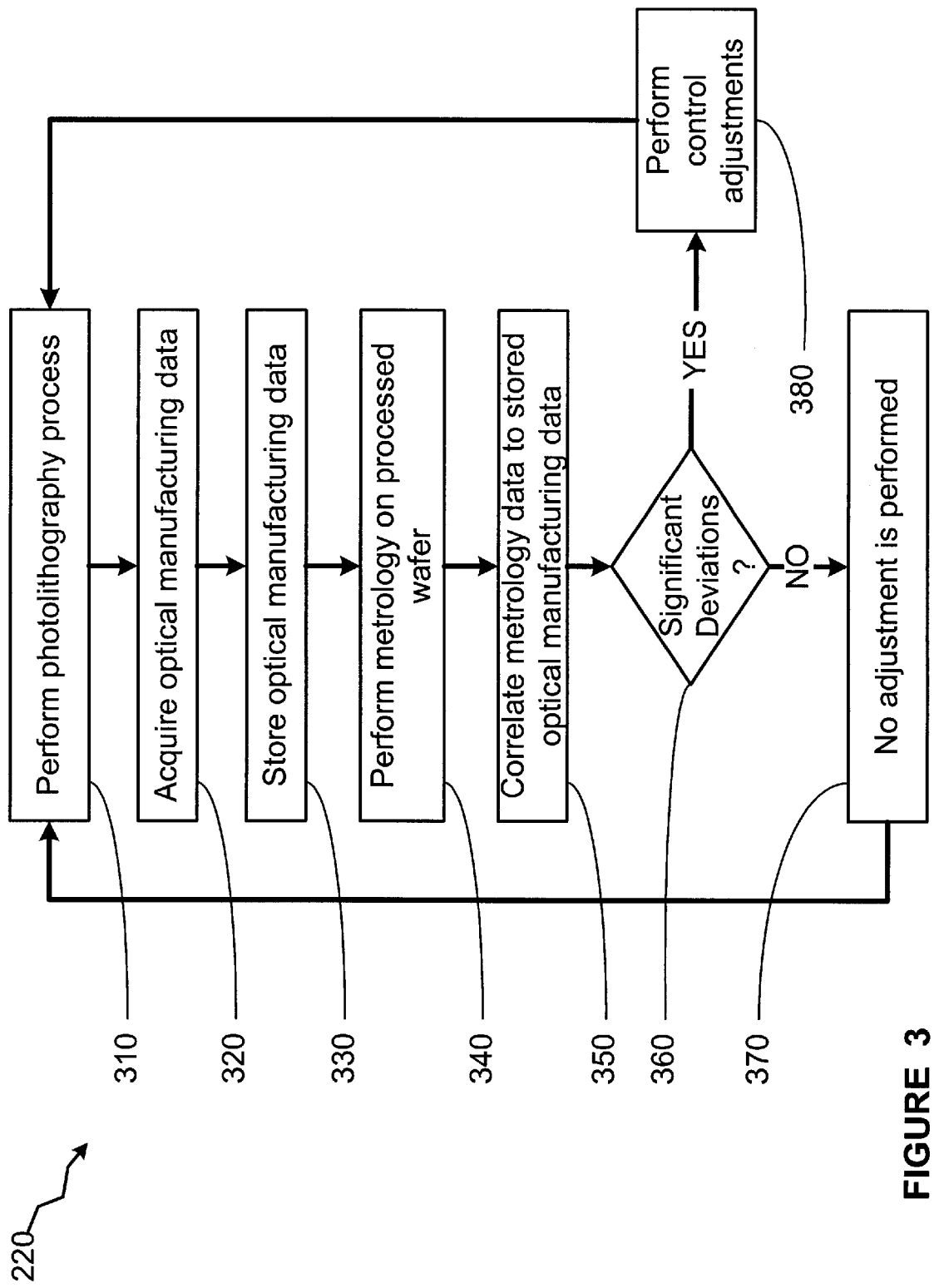
FIG. 3 illustrates a flowchart representation of a more detailed depiction of the method of performing the optical data analysis and the control modifications steps described in FIG. 2.

Turning now to FIG. 3, in one embodiment, a photolithography process is performed on the semiconductor product 105, such as a semiconductor wafer, as described in block 310 of FIG. 3. As the photolithography process is performed on the semiconductor wafer, the optical sensor 160 acquires optical manufacturing data corresponding to the photolithography process being performed, as described in block 320 of FIG. 3. One embodiment of the arrangement of the apparatus for acquiring optical manufacturing data is illustrated in FIG. 4.

Figure 4:
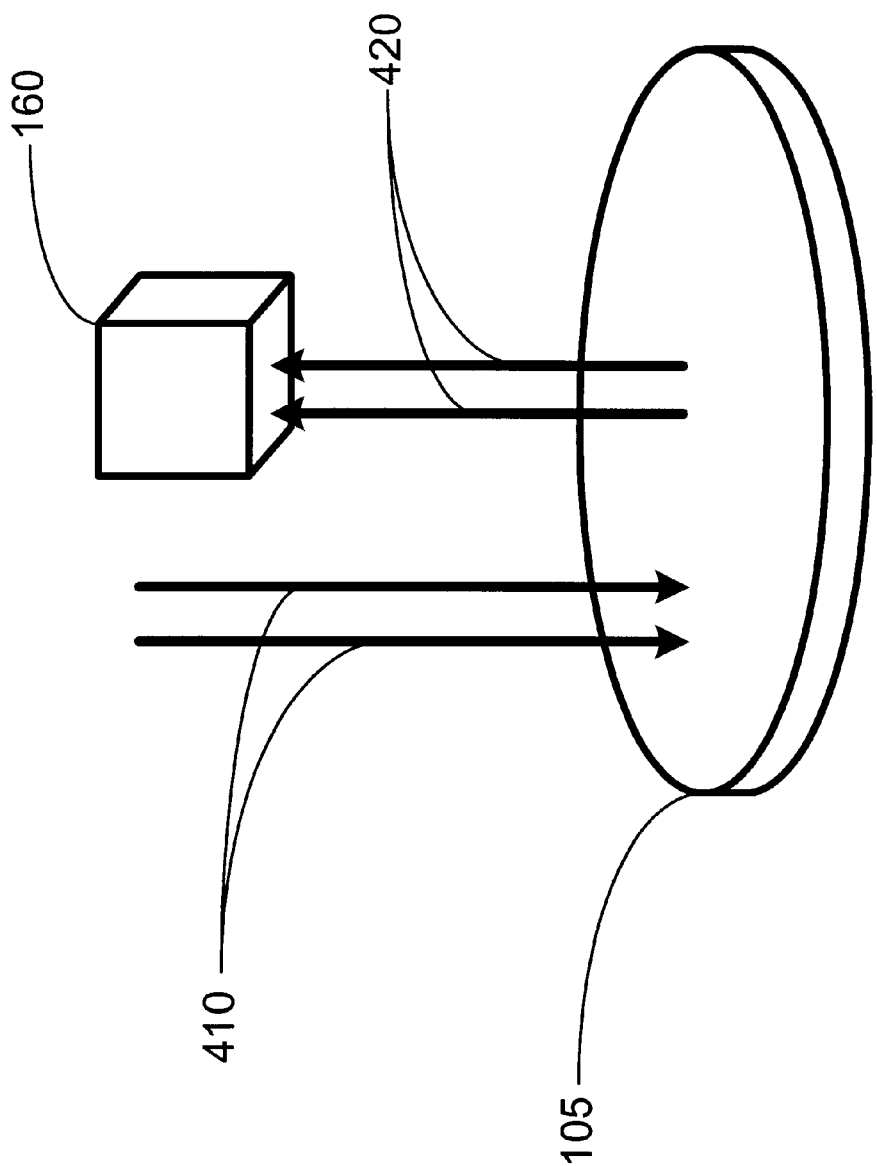
FIG. 4 illustrates one embodiment of a diagram for acquiring optical manufacturing data as described by the present invention.

Turning now to FIG. 4, photolithography light element 410 illuminates a semiconductor product 105, such as semiconductor wafer. In one embodiment, reflected process light 420, which is the reflected photolithography light element 410 from the semiconductor product 105, is captured by the optical sensor 160, as illustrated in FIG. 4. In one embodiment, the intensity of the reflected process light 420 is recorded by the optical sensor 160.

Analysis of the optical measurement data using the apparatus illustrated in FIG. 4 is based on the intensity of the reflected process light 420 as compared to a predetermined reference range of a minimum reflectance and a maximum reflectance. In other words, the intensity of the reflected process light 420, as determined by the optical sensor 160, is quantified by utilizing a reference range of reflectance. The minimum reflectance and the maximum reflectance can be determined by those skilled in the art. In one embodiment, a quality of a processed semiconductor wafer is associated with a predetermined intensity of the reflected process light 420. When the measured intensity of the reflected process light 420 is below the minimum reflectance or above the maximum reflectance, the quality of the processed semiconductor wafer may not be within acceptable specifications.

Figure 5:
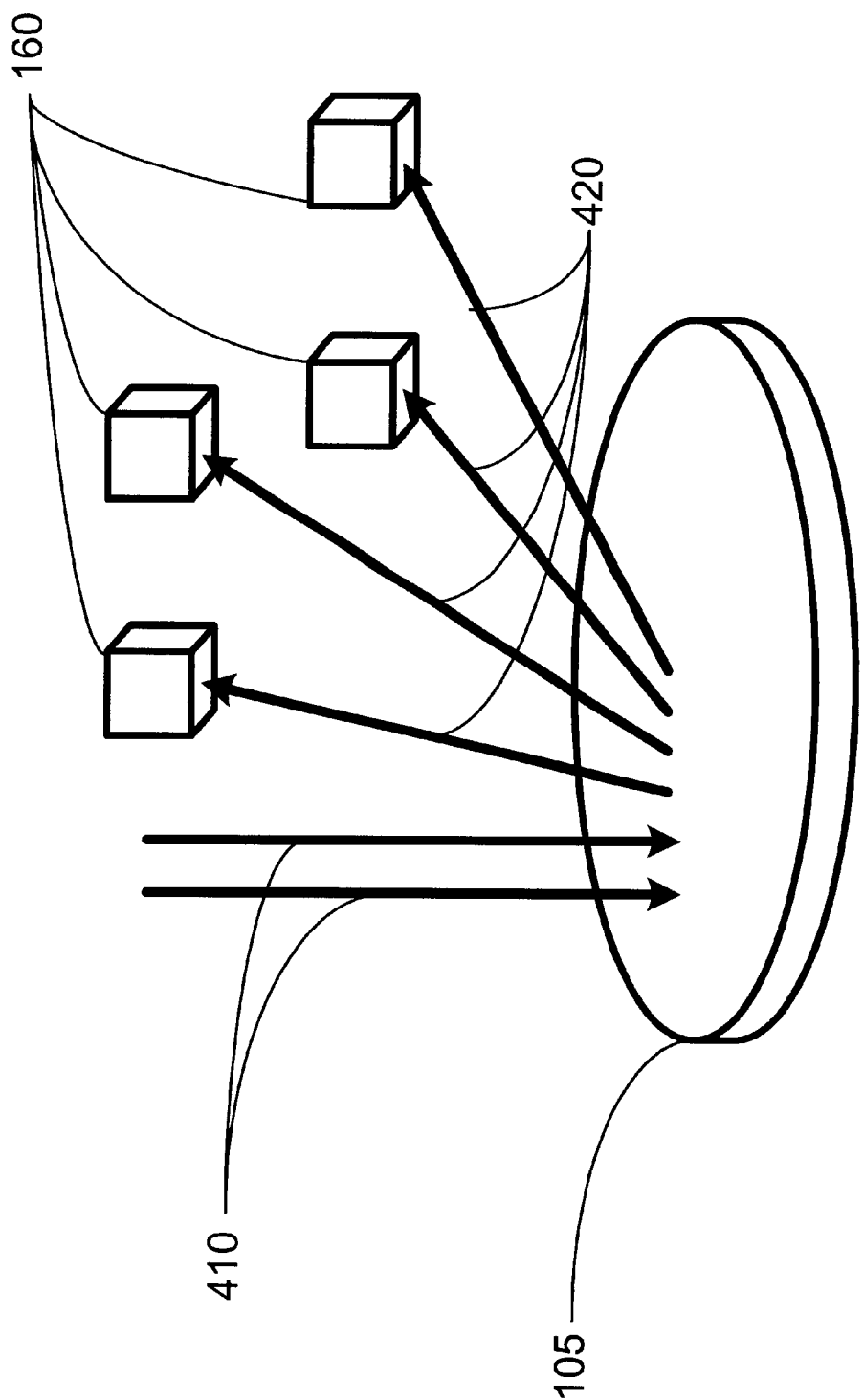
FIG. 5 illustrates an alternative embodiment of a diagram for acquiring optical manufacturing data as described by the present invention.

An alternative embodiment of the arrangement of the apparatus for acquiring optical manufacturing data is illustrated in FIG. 5. In one embodiment, an array of optical sensors 160 is used to capture the reflected process light 420 that are the reflections of the photolithography light element 410 from the semiconductor product 105. In one embodiment, the array of optical sensors 160 is used to acquire data relating to the angle of reflection of the reflected process light 420, as illustrated in FIG. 5.

In one embodiment, a predetermined reference angle that corresponds to an acceptable manufacturing output is defined. In other words, a reference angle of the reflected process light 420 is defined, which corresponds to a reflected angle that would be realized if a semiconductor wafer that has an acceptable manufacturing quality were to be processed. The reference angle of the reflected process light 420 can be determined by those skilled in the art who have the benefit of the present disclosure. The reflection angle of the reflected process light 420 that is acquired by the array of optical sensors 160 is then compared to the predetermined reference angle. When the series of reflection angles of the reflected process light 420 are not within an acceptable range of the predetermined reference angle, the quality of the processed semiconductor wafer may not be within acceptable specifications.

Turning back to FIG. 3, once the optical manufacturing data is acquired, the optical manufacturing data is stored into a data storage medium for later retrieval, as described in block 330 of FIG. 3. Generally, the optical manufacturing data is stored into the data storage medium when the photolithography process is concluded. In one embodiment, the optical manufacturing data is stored into a storage medium (not shown) that is located within the computer system 130. In one embodiment, the optical manufacturing data that is acquired is stored in a corresponding sequence relating to the sequence of the semiconductor wafers that are processed. Therefore, optical manufacturing data corresponding to any particular processed semiconductor wafer can be retrieved by a process control system, which in one embodiment resides in the computer system 130.

Once the acquired optical manufacturing data is stored for later retrieval, which is generally performed when a photolithography process is completed, a metrology process is performed on the processed semiconductor wafer, as described in block 340 of FIG. 3. In one embodiment, the semiconductor wafer processed by the processing tool 110, 112 is sent to the metrology tool 150 for acquisition of metrology data or manufacturing data. The metrology data is sent from the metrology tool 150 to the computer system 130 through the line 155. Once the metrology data is acquired for a particular processed semiconductor wafer, the metrology data is correlated to the corresponding optical manufacturing data, as described in block 350 of FIG. 3.

Once the metrology data for a particular processed semiconductor wafer is correlated with its corresponding optical manufacturing data, a determination is made whether there are significant deviations between the actual result of the processing of the semiconductor wafers and the expected result, as described in block 360 of FIG. 3. The determination of whether there are significant deviations between the actual result of the processing of the semiconductor wafers and the expected result is made by comparing the acquired optical manufacturing data to the reference optical data and the metrology data.

When a determination is made that there are no significant deviations between the actual manufacturing results and the expected results, no adjustments to the process control are performed, as described in block 370 of FIG. 3. In one embodiment, when no adjustments to the process control are performed, a subsequent photolithography process on semiconductor wafers is performed, as shown in FIG. 3. When a determination is made that there are significant deviations between the actual manufacturing results and the expected results, control adjustments to the process control are performed, as described in block 380 of FIG. 3.

The control adjustments described in block 380 of FIG. 3 include modifying the reference plane of focus during a photolithography process. In other words, the focus of the photolithography light element 410 is modified. In one embodiment, the reference plane of focus is modified by changing the relative positioning of the semiconductor wafer being processed and the source (not shown) of the photolithography light element 410.

Figure 6:
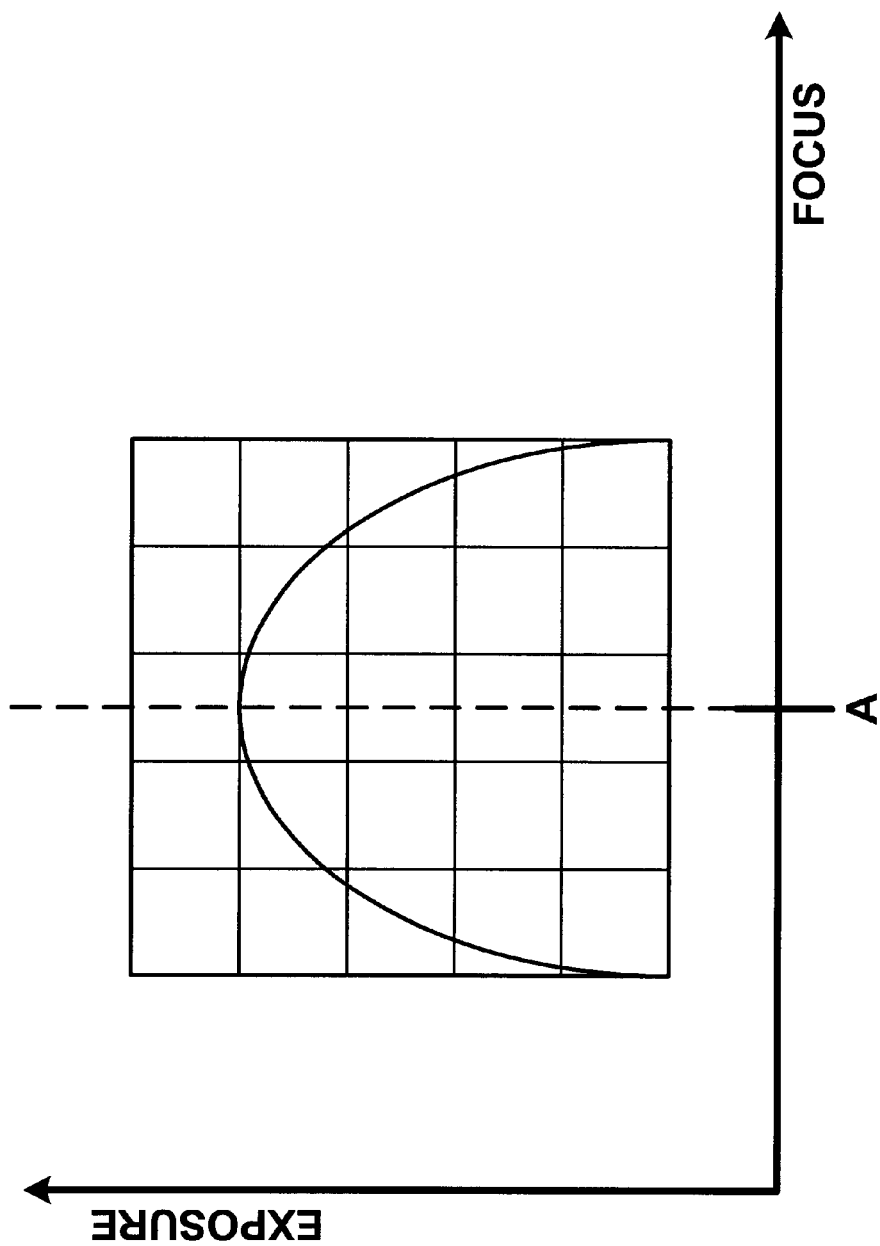
FIG. 6 illustrates one embodiment of a Focus-Exposure graph generated by the optical manufacturing data described by the present invention.

Another control adjustment that may be made is altering the period of time of the flash associated with the photolithography light element 410. Still another control adjustment that may be made is altering the exposure dose of the photolithography light element 410, or altering the intensity of the photolithography light element 410. FIG. 6 illustrates an exposure-focus graph, wherein point A on the focus-axis represents an ideal focus setting for a photolithography process. The focus point A on the graph in FIG. 6 may be determined manually by one skilled in the art. The focus point A on the graph in FIG. 6 may be determined automatically by the computer system 130 using the acquired optical manufacturing data acquired by the optical sensor(s) 160. It is understood that other control adjustments that control photolithography process known to those skilled in the art can be made to perform the methods taught by the present invention. Once the control adjustment are performed, subsequent processing should result in improved feature size and improved resolution in photolithography processes. Once the control adjustments are performed, the new control structure that controls the subsequent photolithography process can be used to perform subsequent manufacturing runs of semiconductor wafers.

Turning back to FIG. 2, the completion of the control adjustments, which is performed in response to a determination that there are significant deviations between the actual manufacturing results and the expected results as described in FIG. 3, concludes the optical data analysis and control modification, described in block 220 of FIG. 2. The new control inputs for the photolithography process are used to perform subsequent manufacturing runs of semiconductor wafers, as described in block 230 of FIG. 2. The steps described in FIGS. 2 and 3 can be performed automatically utilizing computer software programs integrated with a process control system, such as an APC framework, which in one embodiment resides in the computer system 130. The principles taught by the present invention can be implemented into other types of manufacturing frameworks.

The principles taught by the present invention can be implemented in an Advanced Process Control (APC) Framework. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for performing automatic control adjustments during photolithography processes, comprising:

processing a plurality of semiconductor devices;

performing optical data analysis upon at least one of said processed semiconductor devices by correlation with metrology data; and performing control adjustments to said processing in response to said optical data analysis.

2. The method described in claim 1, wherein performing a process run of semiconductor devices further comprises processing semiconductor wafers.

3. The method described in claim 2, wherein processing semiconductor wafers further comprises performing a photolithography process on said semiconductor wafers.

4. The method described in claim 3, wherein performing photolithography process further comprises performing an overlay process upon said semiconductor wafers.

5. The method described in claim 1, wherein performing optical data analysis further comprises:

performing a photolithography process upon a semiconductor wafer;

acquiring optical manufacturing data from said processing of semiconductor wafer;

storing said optical manufacturing data;

performing a metrology data acquisition upon said semiconductor wafer;

correlating said optical manufacturing data and said metrology data;

determining whether a significant deviation exists between said correlated optical manufacturing data and said metrology data; and performing control adjustments in response to a determination that a significant deviation exists between said correlated optical manufacturing data and said metrology data.

6. The method described in claim 5, wherein acquiring optical manufacturing data further comprises acquiring data relating to an intensity of a reflected process light.

7. The method described in claim 5, wherein acquiring optical manufacturing data further comprises acquiring data relating to an angle of reflection of a reflected process light.

8. The method described in claim 5, wherein storing said optical manufacturing data further comprises storing said optical manufacturing data in a memory of a computer system.

9. The method described in claim 5, wherein determining whether a significant deviation exists between said correlated optical manufacturing data and said metrology data further comprises comparing said optical manufacturing data to a predetermined reference optical data that corresponds to a reference metrology data.

10. The method described in claim 5, wherein performing control adjustments further comprises modifying a reference plane of focus during a photolithography process.

11. The method described in claim 10, wherein modifying a reference plane of focus further comprises modifying the relative positioning of a semiconductor wafer being processed and a source of a photolithography light element.

12. The method described in claim 5, wherein performing control adjustments further comprises altering a period of time of the flash associated with a photolithography light element.

13. The method described in claim 5, wherein performing control adjustments further comprises altering an exposure dose of a photolithography light element.

14. The method described in claim 13, wherein altering an exposure dose of a photolithography light element further comprises altering an intensity of a photolithography light element.

15. An apparatus for performing automatic control adjustments during photolithography processes, comprising:
    a processing tool capable of processing semiconductor devices;
    an optical sensor coupled with said processing tool, said optical sensor being capable of acquiring optical manufacturing data during the operation of said processing tool;
    a machine interface electronically coupled with said processing tool and said optical sensor such that said machine interface is capable of delivering a control signal to said processing tool and receiving the optical manufacturing data from said optical sensor;
    a metrology tool coupled with said processing tool, said metrology tool being capable of receiving a processed semiconductor wafer from said processing tool and performing metrology data acquisition upon said processed semiconductor wafer; and
    a system electronically interfaced with said machine interface and said metrology tool, said system being capable of receiving data from said machine interface and sending a control signal to said machine interface.

16. The apparatus described in claim 15, wherein said processing tool is a photolithography process tool.

17. The apparatus described in claim 15, wherein said optical sensor is capable of detecting the intensity of a reflected process light.

18. The apparatus described in claim 15, wherein said optical sensor is capable of detecting the angle of reflection of a reflected process light.

19. The apparatus described in claim 18, wherein said optical sensor further comprises an array of optical sensors.

20. The apparatus described in claim 15, wherein said computer system further comprises process control system embedded into said computer system.

21. An apparatus for performing automatic control adjustments during photolithography processes, comprising:
    means for processing a plurality of semiconductor devices;
    means for performing optical data analysis upon at least one of said processed semiconductor devices by correlation with metrology data; and
    means for performing control adjustments to said processing in response to said optical data analysis.

22. A method for performing automatic control adjustments during photolithography processes, comprising:
    performing a photolithography process upon a semiconductor wafer;
    acquiring optical manufacturing data from said processing of said semiconductor wafer;
    storing said optical manufacturing data in a memory of a computer system;
    performing a metrology data acquisition upon said semiconductor wafer;
    correlating said optical manufacturing data and said metrology data;
    determining whether a significant deviation exists between said correlated optical manufacturing data and said metrology data; and
    performing control adjustments in response to a determination that a significant deviation exists between said correlated optical manufacturing data and said metrology data.

23. The method described in claim 22, wherein acquiring optical manufacturing data further comprises acquiring data relating to an intensity of a reflected process light.

24. The method described in claim 22, wherein acquiring optical manufacturing data further comprises acquiring data relating to an angle of reflection of a reflected process light.

25. The method described in claim 22, wherein determining whether a significant deviation exists between said correlated optical manufacturing data and said metrology data further comprises comparing said optical manufacturing data to a predetermined reference optical data that corresponds to a reference metrology data.

26. The method described in claim 22, wherein performing control adjustments further comprises modifying a reference plane of focus during a photolithography process.

27. The method described in claim 26, wherein modifying a reference plane of focus further comprises modifying the relative positioning of a semiconductor wafer being processed and a source of a photolithography light element.

28. The method described in claim 22, wherein performing control adjustments further comprises altering a period of time of the flash associated with a photolithography light element.

29. The method described in claim 22, wherein performing control adjustments further comprises altering an exposure dose of a photolithography light element.

30. The method described in claim 29, wherein altering an exposure dose of a photolithography light element further comprises altering an intensity of a photolithography light element.

* * * * *